US010403508B2

(12) United States Patent
Tanaka et al.

(10) Patent No.: US 10,403,508 B2
(45) Date of Patent: Sep. 3, 2019

(54) IMPRINT APPARATUS, IMPRINTING METHOD, AND MANUFACTURING METHOD OF ARTICLE

(71) Applicant: CANON KABUSHIKI KAISHA, Tokyo (JP)

(72) Inventors: Yusuke Tanaka, Tokyo (JP); Takahiro Matsumoto, Utsunomiya (JP); Tatsuya Hayashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 258 days.

(21) Appl. No.: 15/236,169

(22) Filed: Aug. 12, 2016

(65) Prior Publication Data

US 2017/0057153 A1 Mar. 2, 2017

(30) Foreign Application Priority Data

Aug. 31, 2015 (JP) ................................ 2015-171201

(51) Int. Cl.
*H01L 21/31* (2006.01)
*H01L 21/3105* (2006.01)
*G03F 7/004* (2006.01)

(52) U.S. Cl.
CPC .......... *H01L 21/3105* (2013.01); *G03F 7/004* (2013.01)

(58) Field of Classification Search
CPC ... H01L 21/3105; G03F 7/004; B29C 64/124; B29C 64/129; B29C 64/135; B29C 64/245; B29C 64/264; B29C 64/268; B29C 64/286; B33Y 30/00; B33Y 99/00; B33Y 10/00
See application file for complete search history.

(56) References Cited

FOREIGN PATENT DOCUMENTS

JP 2013-102137 A 5/2013
JP 2013102137 A * 5/2013 ........... G03F 7/0002

* cited by examiner

*Primary Examiner* — Anthony Calandra
*Assistant Examiner* — Jamel M Nelson
(74) *Attorney, Agent, or Firm* — Canon U.S.A. Inc., IP Division

(57) ABSTRACT

An imprint apparatus according to an exemplary embodiment of the present disclosure, the imprinting apparatus forming a pattern on a region of a substrate to be processed using a mold, the imprint apparatus including a mount portion on which the substrate is mounted, and a heating unit that heats the region to be processed. On the basis of information related to a difference in shape between a pattern area of the mold and the region to be processed and information related to a contact pressure exerted between the substrate and the mount portion, the heating unit heats the region to be processed such that the difference in shape between the pattern area of the mold and the region to be processed is reduced.

11 Claims, 8 Drawing Sheets

SUBSTRATE SHAPE (BROKEN LINE — — —)
CHUCK SHAPE (BROKEN LINE ·········)

POSITION IN WAFER IN X AXIS DIRECTION

GAP d BETWEEN SUBSTRATE AND CHUCK
(SOLID LINE ———)

POSITION IN WAFER IN X AXIS DIRECTION

IMPRINT APPARATUS, IMPRINTING METHOD, AND MANUFACTURING METHOD OF ARTICLE

BACKGROUND OF THE INVENTION

Field of the Invention

The present disclosure relates to an imprint apparatus, an imprinting method, and a manufacturing method of an article.

Description of the Related Art

An imprinting method is known as a method for forming a minute pattern on a substrate for fabricating a semiconductor device and the like. The imprinting method uses a mold having an uneven pattern to mold an imprint material and to form a pattern of the imprint material on the substrate.

In Japanese Patent Laid-Open No. 2013-102137, in order to deform a partial area of a region to be processed in which a pattern is formed by a single press of a mold, the partial area is heated by photoirradiation. A shape of the region to be processed and a shape of an uneven pattern of the mold is made to become close to each other in order to increase the overlay precision. Furthermore, by having static friction force be exerted between a substrate mount portion on which the substrate is mounted and the substrate, the substrate will not easily become deformed in a direction (in a horizontal direction) that extends along the mount surface of the substrate. In view of the above, Japanese Patent Laid-Open No. 2013-102137 discloses a technique in which a thermal dose needed for deformation is determined based on an attraction pressure read by a control unit.

SUMMARY OF THE INVENTION

The inventors of the present application have found that the ease of thermal deformation differs at different positions owing to difference in contact pressure exerted between a substrate and a mount portion. The difference in contact pressure is caused by warping of the substrate that is caused by a distorted shape and the like of a base layer. However, no description related to the above is given in Japanese Patent Laid-Open No. 2013-102137.

An imprint apparatus according to an exemplary embodiment of the present disclosure is an imprint apparatus that forms a pattern in a region of a substrate to be processed using a mold, the imprint apparatus includes a mount portion on which the substrate is mounted, and a heating unit that heats the region to be processed. On the basis of information related to a difference in shape between a pattern area and the region to be processed and information related to a contact pressure exerted between the substrate and the mount portion, the heating unit heats the region to be processed such that the difference in shape between the pattern area and the region to be processed is reduced.

Further features of the present invention will become apparent from the following description of exemplary embodiments with reference to the attached drawings.

DESCRIPTION OF THE EMBODIMENTS

First Exemplary Embodiment

Configuration of Apparatus

Figure 1:
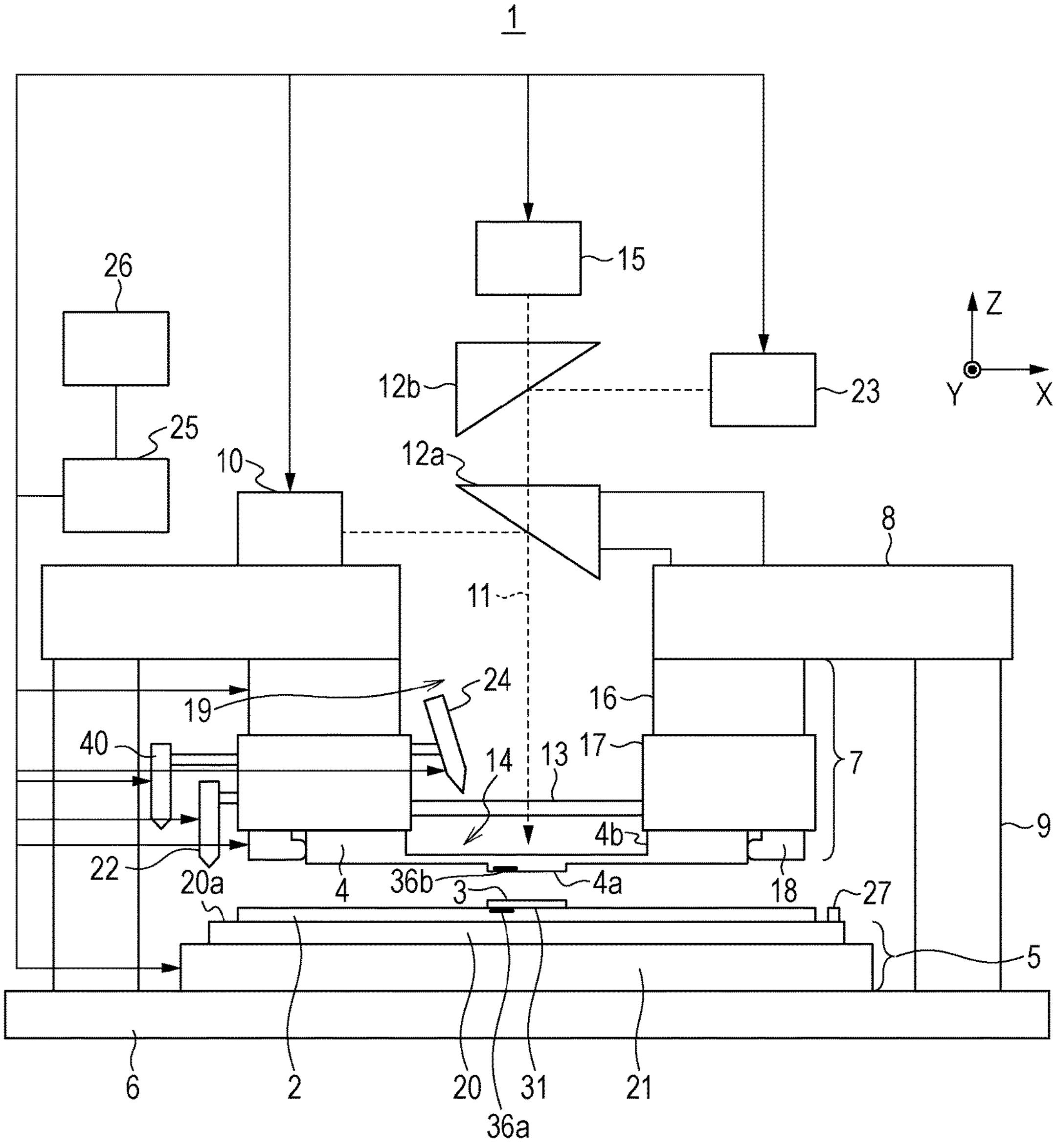
FIG. 1 is diagram illustrating a configuration of an imprint apparatus according to a first exemplary embodiment.

FIG. 1 is diagram illustrating a configuration of an imprint apparatus 1 according to a first exemplary embodiment of the present disclosure. The vertical direction is the Z axis, and the two axes orthogonal to each other on a plane (a horizontal plane) that is perpendicular to the Z axis are the X axis and the Y axis. The imprint apparatus 1 forms a pattern on a photosetting imprint material (an imprint material) 3 coated on a substrate 2 by curing the imprint material 3 while the imprint material 3 and a mold 4 are in contact with each other and by releasing the imprint material from the mold 4.

A curing composition (also referred to as an imprint material in an uncured state) that is cured by being given curing energy is used as the imprint material 3. An electromagnetic wave, heat, or the like is used as the curing energy. The electromagnetic wave is, for example, light, such as an infrared ray, a visible ray, or an ultraviolet ray, which is selected from a wavelength ranging from 10 nm or higher to 1 mm or lower.

The curing composition is a composition that is cured upon irradiation of light or by being heated. Between the above, a photosetting composition, which is cured by light, contains at least a polymerizable compound and a photoinitiator, and may contain a non-polymerizable compound and a solvent as needed. The non-polymerizable compound is at least one selected from a group including non-polymerizable compound, a sensitizer, a hydrogen donor, an internal mold release agent, a surfactant, an oxidation inhibitor, and a polymer component.

The imprint material 3 is applied on the substrate 2 in a form of a film with a spin coater or a slit coater. Alternatively, the imprint material 3 may be applied with a liquid ejection head on the substrate 2 in a form of a drop let or in a form of an island or a film formed by connecting of a plurality of droplets. The viscosity (the viscosity at 25° C.) of the imprint material 3 is from 1 mPa·s or higher to 100 mPa·s or lower.

Glass, ceramic, metal, a semiconductor, an imprint material, or the like is used for the substrate 2, and as needed, a member formed of a different material may be formed on a surface of the substrate 2. Specifically, the substrate 2 is a silicon wafer, a compound semiconductor wafer, a quartz glass, or the like.

A support 9 for supporting a bridge platen 8 is provided in a vertical direction of a base platen 6 on which a substrate stage 5 is mounted. A holding mechanism 7 that holds the mold 4 is provided below the bridge platen 8.

An irradiation portion 10 emits an ultra violet ray 11 for curing the imprint material 3 in an uncured state in a horizontal direction. The substrate is irradiated with the ultraviolet ray 11, which has been reflected vertically downwards with an optical element (a dichroic mirror, for example) 12*a*, through the mold 4.

The mold 4 has a rectangular outer periphery and includes a rectangular pattern portion (a pattern area of the mold 4) 4*a* at a middle portion thereof in which an uneven pattern is formed. With an operation (an impressing operation) of pressing the mold 4 against the imprint material 3, a transfer pattern of the pattern portion 4*a* is formed in a pattern area (a region to be processed) 31 that is formed on the substrate 2 and that has a size that is substantially the same as that of the pattern portion 4*a*.

In the present exemplary embodiment, the size of the pattern area 31 is the same as a size of a shot area. The shot area is a unit area of the base layer that has a formed pattern, and the size of a single shot area is, for example, about 26 mm×33 mm. A single or a plurality of patterns having a chip size requested by the user is formed in a single shot area.

The mold 4 has a cavity (a recessed portion) 4*b*, which has a circular outer periphery, on a surface on the other side with respect to the pattern portion 4*a*. A transmitting member 13 transmits the ultraviolet ray 11 and a heating light emitted from a heating mechanism (a heating unit) 15 described later and is disposed such that a space including a portion of a light-passing area and the cavity 4*b* becomes a closed space.

When pressing the pattern portion 4*a* against the imprint material 3, the pressure of the space 14 is regulated with a pressure regulator (not shown) such that the pattern portion 4*a* is deformed so as to protrude downwards. By performing the operation of pressing the pattern portion 4*a* against the imprint material 3 while the pattern portion 4*a* is in the deformed state, bubbles being mixed in the recessed portion of the pattern portion 4*a* can be prevented when the imprint material 3 is filled into the pattern portion 4*a*, and the imprint material 3 can be filled to all the corners of the recessed portion of the pattern portion 4*a*.

When the imprint material 3 is a photosetting material, the mold 4 is formed of a material that transmits the ultraviolet ray 11 and the heating light that is emitted from the heating mechanism 15 described later. For example, the imprint material 3 is a glass, such as a quartz glass, a silicate glass, a calcium fluoride glass, a magnesium fluoride glass, or an acrylic glass, is an imprint material such as sapphire, gallium nitride, polycarbonate, polystyrene, acryl, or polypropylene, or is a material in which some of the above are optionally layered.

The holding mechanism 7 includes a mold chuck 16 that attracts the mold 4 by vacuum suction force or electrostatic force, a drive mechanism 17 that moves the mold 4 together with the mold chuck 16, and a deformation mechanism 18 that deforms the mold 4. The mold chuck 16 and the drive mechanism 17 include a light-passing area 19 at the middle portion so that the ultraviolet ray 11 from the irradiation portion 10 reaches the substrate 2.

The deformation mechanism 18 deforms the mold 4 into a desired shape by applying external force in the horizontal direction to the mold 4. With the above, the difference in shape between the pattern area 31 and the pattern portion 4*a* can be reduced (the difference in shape between the region to be processed and the pattern area of the mold can be reduced). Accordingly, the overlay precision between the pattern of the imprint material 3 and the pattern of the base layer can be increased.

The drive mechanism 17 moves the mold 4 in the Z axis direction. With the above, the mold 4 performs the operation of impressing itself against the imprint material 3 and an operation (a mold release operation) of separating itself from the imprint material 3. An actuator employed in the drive mechanism 17 is, for example, a linear motor or an air cylinder. The drive mechanism 17 may be configured of a plurality of driving systems, such as a coarse motion driving system and a fine motion driving system. Furthermore, not only in the Z axis direction, drive mechanisms that drive in the X axis direction, the Y axis direction, and in the rotation directions about the shafts may be provided. With the above, positioning of the mold 4 with high precision can be performed.

Note that the impressing operation and the mold release operation can be performed by moving the substrate in the Z axis direction using the substrate stage 5 rather than moving the mold 4 in the Z axis direction. Alternatively, both the mold 4 and the substrate 2 can be moved in the Z axis direction.

The substrate stage 5 includes a chuck (a substrate mount portion) 20 that attracts the mounted substrate 2 to a holding surface (a substrate mount surface) 20*a*, and a drive mechanism 21 that moves the substrate 2 together with the chuck 20. A fiducial mark 27 is provided on the substrate stage 5 and is used to align the mold 4.

Figure 2:
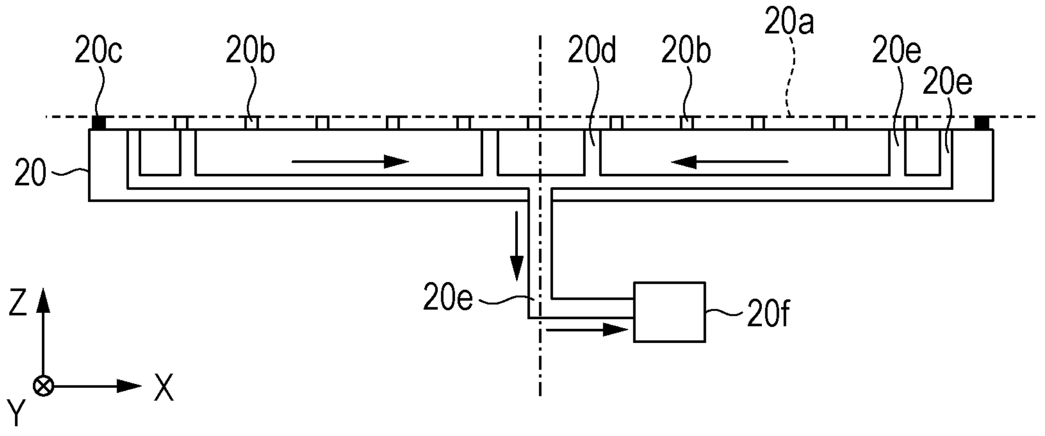
FIG. 2 is diagram illustrating a configuration of a chuck according to the first exemplary embodiment.

FIG. 2 is a diagram illustrating a configuration of the chuck 20. A plurality of pin-shaped support members 20*b*, and a single annular member 20*c* disposed so as to surround the support members 20*b* are provided on the side of the chuck 20 in which the substrate is held. The substrate 2 is mounted on the support members 20*b* and the annular member 20*c*. Furthermore, as illustrated in FIG. 2, a plurality of holes 20*d* are provided in the chuck 20. Common pipes 20*e* that are in communication with the holes 20*d* are connected to a vacuum pump 20*f*.

Since the substrate attraction unit of the present exemplary embodiment includes the pipes 20*e*, and the vacuum pump 20*f*, the substrate 20 is attracted to and held by the chuck 20 at a substantially uniform attraction pressure. The chuck 20 is capable of regulating the force attracting the substrate 2 on the basis of a command from a control unit 25 described later. In the present exemplary embodiment, the substrate 2 is attracted vertically downwards. Other than the vacuum suction force, the substrate 2 may be attracted and held by force created by electrostatic force or by mechanically pushing the substrate 20.

The holding surface 20*a* is a virtual surface defined by tips of the support members 20*b* and the annular member 20*c*. Note that the pipes 20*e* may be divided into a plurality of systems, and each divided area may include a mechanism that is capable of regulating the attraction pressure force and regulate the suction force (the attraction force). Pattern defect occurring when releasing the mold can be reduced by regulating the attraction pressure in some of the areas to a lower attraction pressure.

Returning to the description of FIG. 1, the drive mechanism 21 moves the substrate 2 in the XY plane. With the above, positioning between the mold 4 and the pattern area 31 on the substrate 2 is performed. An actuator employed in the drive mechanism 21 is, for example, a linear motor or a planar pulse motor. The drive mechanism 21 may be configured of a plurality of driving systems, such as a coarse motion driving system and a fine motion driving system. Furthermore, not only in the X axis direction and the Y axis direction, drive mechanisms that drive in the Z axis direction and in the rotation directions about the shafts may be provided. With the above, positioning of the substrate 2 with high precision can be performed.

In the course of a semiconductor process, the shape of the pattern area 31 is slightly deformed into a shape in which deformation components, such as a magnification component, a parallelogram component, and a trapezoid component, are combined. By heating the pattern area 31 and deforming the pattern area 31 so that the pattern area 31 becomes close to a desired shape, the heating mechanism 15 is capable of reducing the difference in shape between the pattern area 31 and the pattern portion 4*a*.

Figure 3:
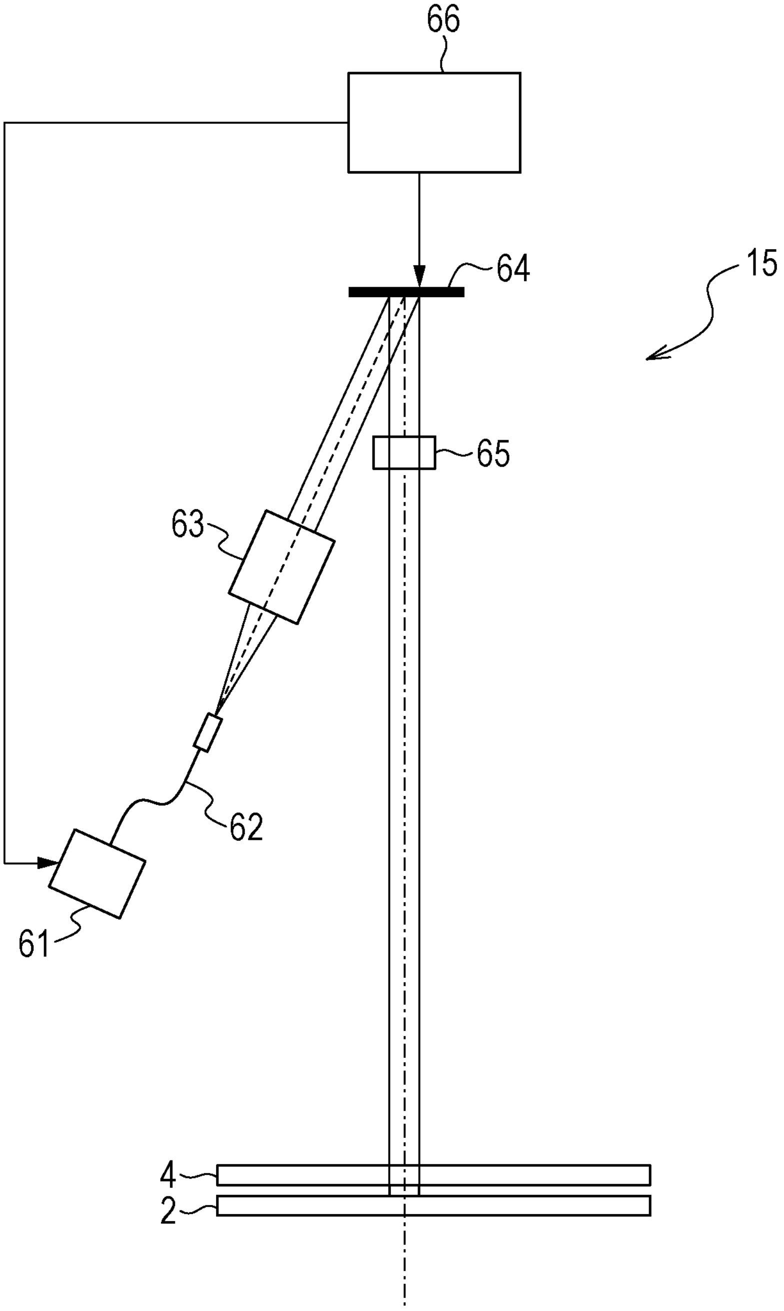
FIG. 3 is a diagram illustrating a configuration of a heating mechanism according to the first exemplary embodiment.

FIG. 3 is a diagram illustrating a configuration of the heating mechanism (a heating unit) 15. The light source 61 emits a heating light for heating and deforming the substrate 2. The wavelength of the heating light is desirably a wavelength that does not cure the uncured imprint material 3 and that is absorbed by the substrate 2 as heat. The wavelength is 400 nm to 2000 nm, for example. The heating light is incident on a digital micro-mirror device (DMD) 64 through an optical fiber 62 and an optical system 63, and the substrate 2 is irradiated with only the heating light that has been selectively reflected at the DMD 64.

An optical element 12*a* that reflects the ultraviolet ray 11 emitted from the irradiation portion 10 and that transmits the heating light is disposed in an optical path of the heating light. An optical element (a dichroic mirror) 12*b* that reflects the light emitted from a light source for a monitor 23 vertically downwards and that transmits almost all of the heating light is further disposed in the optical path of the heating light.

For example, a high output semiconductor laser is used as the light source 61. The optical system 63 includes a collection optical system (not shown) that collects the light emitted from the light source 61, and a uniform illumination optical system (not shown) that uniformizes the intensity of the light from the collection optical system that illuminates the DMD 64. The uniform illumination optical system includes optical elements such as, for example, a microlens array (MLA) (not shown) and the like.

The DMD 64 includes a plurality of micromirrors (not shown) that reflect the heating light. An irradiation control unit 66 tilts each of the micromirrors at an angle of −12 degrees (ON state) or +12 degrees (OFF state) with respect to a plane of array of the micromirrors to control whether to have or not have the illumination of the heating light.

The heating light reflected by the micromirrors in the ON state is formed into an image on the substrate 2 with an optical projection system 65 that brings the DMD 64 and the substrate 2 into a conjugate relationship with respect to each other with the optical system. The light reflected by the micromirrors in the OFF state is reflected in a direction in which the light does not reach the substrate. The size of the area created when all of the heating light that have been reflected by the micromirrors in the ON state is projected onto the substrate 2 is the same as the size of an ideal pattern area 31.

The heating mechanism 15 gives a distribution of the area irradiated and the area that is not irradiated by the heating light when heating a single pattern area 31. With the above, it is possible to locally deform the pattern area 31.

The irradiation control unit 66 includes a CPU, and on the basis of a heat quantity distribution instructed by the control unit 25 described later, the irradiation control unit 66 controls the switching between the ON state and the OFF state of the micromirrors in a selective manner.

The heat quantity distribution includes information related to the period of time of the micromirrors in the ON state and in the OFF state, and information on the illumination distribution in the pattern area 31 formed by distribution of the ON state and the OFF state. A larger heat quantity is given to the pattern area 31 on the substrate 2 as the number of micromirrors in the ON state becomes larger and as the irradiation time period of the heating light becomes larger.

FIGS. 4A to 4D are diagrams illustrating an example of a relationship between the heat quantity distribution, and the heating and deformation of the pattern area 31. As in FIG. 4A, it is assumed that the pattern area 31 including a trapezoid component is deformed only in a single direction (the X direction). It is assumed that, in order to reduce the difference in shape with the pattern portion 4*a*, the upper side of the pattern area 31 needs to be swollen such that the shape of the pattern area 31 becomes closer to the shape of a rectangular area 30. In such a case, as the heat quantity distribution illustrated in FIG. 4B, the illumination distribution and the irradiation time period are set such that the dose applied to the area adjacent to the upper side becomes large. In other words, a dose distribution 32 is formed only in the Y direction and the dose in the X direction is to be uniform.

Figures 4A, 4B, 4C, 4D:
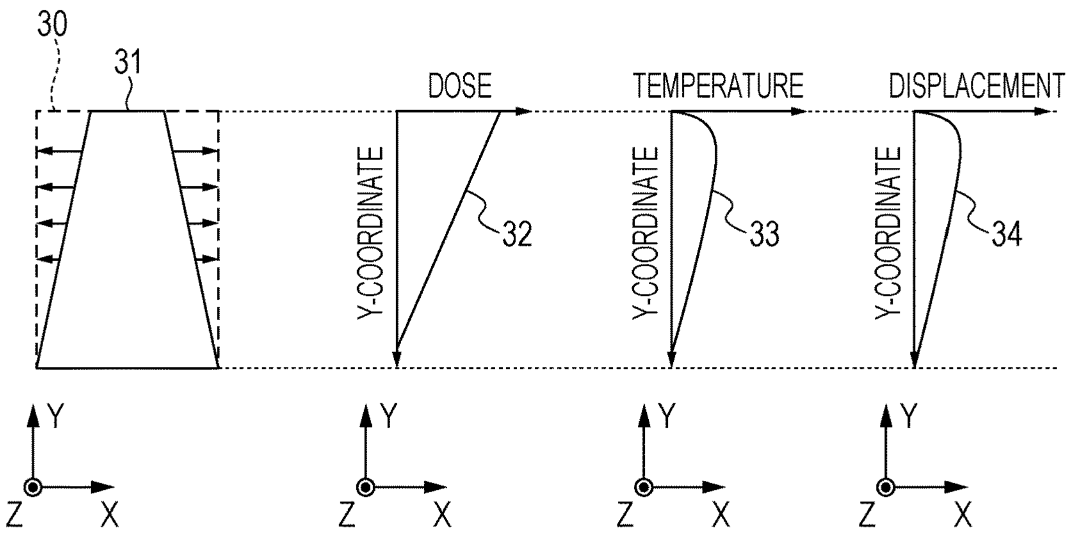
FIGS. 4A to 4E are diagrams for describing thermal deformation performed with a heating mechanism.
Figure 4E:
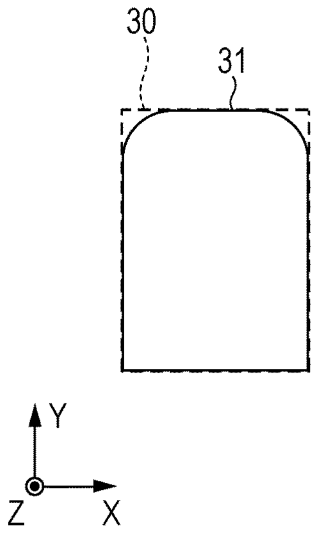

When the pattern area 31 is irradiated with the heating light on the basis of the dose distribution 32 illustrated in FIG. 4B, a temperature distribution 33 illustrated in FIG. 4C is formed in the pattern area 31, and the shape of the pattern area 31 is changed as in the displacement distribution 34 illustrated in FIG. 4D. With the above, the shape of the pattern area 31 can be corrected as illustrated in FIG. 4E. When the pattern area 31 includes only an isotopic magnification component, the heat quantity distribution may be one that forms a uniform temperature distribution in the pattern area 31.

An element other than the DMD 64 may be used if the element is capable of, as is the case of the DMD 64, giving a distribution in the pattern area 31 and heats and deforms the pattern area 31. For example, the element may be a liquid crystal display (LCD).

Returning to the description of FIG. 1, a dispenser 22 supplies the imprint material 3 in an uncured state on the pattern area 31 of the substrate 2. An amount of the imprint material 3 that is needed for a single impressing operation is coated in each coating. Accordingly, the substrate stage 5 reciprocates the substrate 2 between a position below the mold 4 and a position below the dispenser 22 each time an impressing operation is finished.

The monitor 23 uses light to observe the imprint material 3 being filled in the pattern portion 4*a* of the mold 4. With the above, a foreign substance being caught in the pattern portion 4*a* or an unfilled portion in the imprint material 3 can be specified.

An alignment system (a detection portion) 24 simultaneously detects alignment marks 36*a* (hereinafter, referred to as marks 36*a*) formed in a periphery of the pattern area 31 on the substrate 2 and alignment marks 36*b* (hereinafter, referred to as marks 36*b*) formed in the mold 4.

The marks 36*a* and marks 36*b* are formed in a plural number. Detection of the marks 36*a* and 36*b* are performed before and after the mold 4 and the imprint material 3 on the substrate 2 are brought into contact with each other. On the basis of the detection result, the shape of the pattern portion 4*a* and the shape of the pattern area 31 are each obtained. With the above, the difference in shape between the pattern portion 4*a* and the pattern area 31 can be obtained. Note that the marks used for positioning may be different before and after the mold 4 and the imprint material 3 are brought into contact with each other.

According to the detection result detected by the alignment system 24, the control unit 25 described later is capable of obtaining misregistration of the marks 36*a* and 36*b* in the X axis direction, the Y axis direction, and an ωZ axis direction.

A measurement unit (a measurement member) 40 measures a flatness of the substrate 2. A flatness is information indicating the shape of the substrate 2 in an off-plate direction (the Z axis direction or the thickness direction of the substrate 2 in the present exemplary embodiment). It is information indicating the displacements at various positions in the surface of the substrate 2 with respect to a fiducial surface in the off-plate direction. In other words, it is information indicating the uneven shapes of the surface of the substrate 2 facing the mold 4.

A spectral-interference laser displacement sensor with high resolution is used as the measurement unit 40. Note that instead of the spectral-interference laser displacement sensor, a laser displacement sensor, an electrostatic capacitance sensor may be used to reduce the apparatus cost.

The control unit 25 is connected to the substrate stage 5, the holding mechanism 7, the irradiation portion 10, the heating mechanism 15, the monitor 23, the dispenser 22, the alignment system 24, a memory 26, and the measurement unit 40 through a circuit. Using the programs illustrated in the flowcharts in FIGS. 5 and 6 stored in the memory 26 described later, the imprint processing is performed by controlling the control targets described above connected to the control unit 25.

Furthermore, the control unit 25 reads out a variable needed to control the control target, or writes the variable needed to control the control target into the memory 26.

The control unit 25 may be disposed in a housing that is common among the other components of the imprint apparatus 1 or may be disposed external to the housing. Furthermore, the control unit 25 may be an assembly of different control boards each provided per control target.

The control unit 25 includes a CPU, and on the basis of a detection result of the marks 36*a* and 36*b* detected by alignment system 24, the control unit 25 obtains the difference in shape between the pattern portion 4*a* and the pattern area 31. Furthermore, a standard heat quantity distribution (information related to the difference in shape between the region to be processed and the pattern area of the mold, referred to as first information) applied to the substrate 2 with the heating mechanism 15 on the basis of the difference in shape is obtained.

Furthermore, a correction method described later corrects the standard heat quantity distribution by using gap information (information related to the contact pressure), which is a difference between a shape distribution of the substrate 2 in the off-plate direction and a shape distribution of the chuck 20 in the off-plate direction, and obtains a corrected heat quantity distribution.

In the present exemplary embodiment, the gap information is obtained by using the difference in attraction pressure created by the chuck 20. On the basis of the corrected heat quantity distribution, the control unit 25 controls the heating mechanism 15 such that the difference in shape between the pattern area 31 and the pattern portion 4*a* is reduced.

Figure 5:
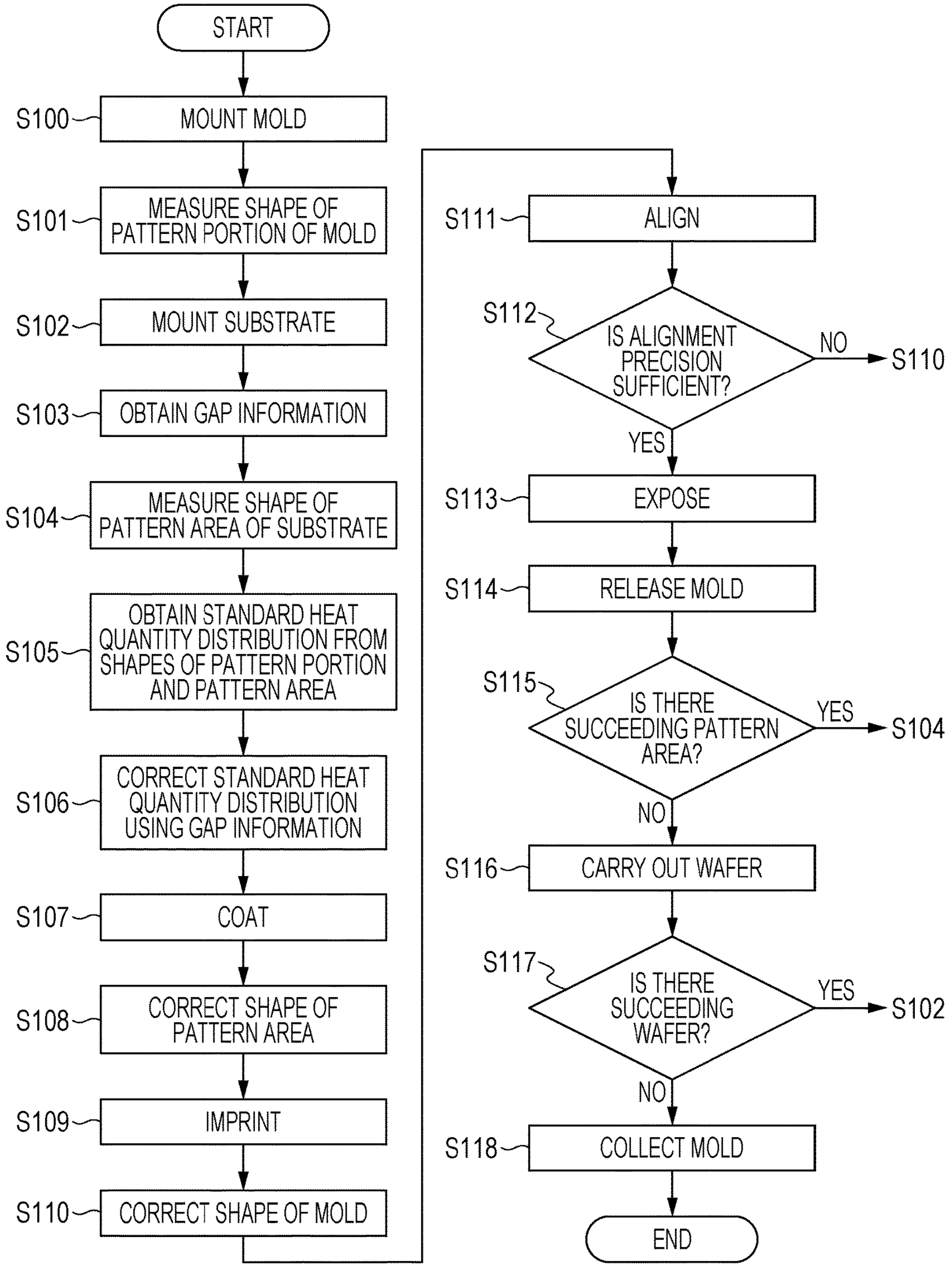
FIG. 5 is a flowchart illustrating a flow of the imprint processing according to the first exemplary embodiment.
Figure 6:
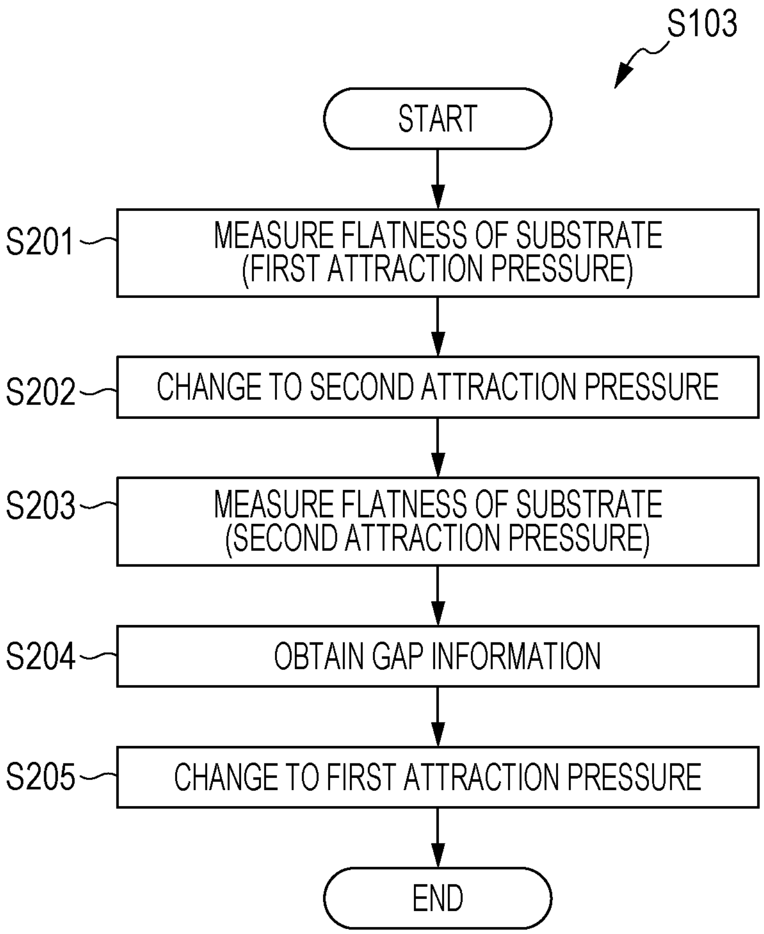
FIG. 6 is a flowchart illustrating how gap information is obtained according to the first exemplary embodiment.

The memory 26 includes a storage medium, such as a hard disk, and stores the programs illustrated in FIGS. 5 and 6 and the deformation amount of the substrate 2 per unit heat quantity. The imprint apparatus 1 sequentially forms patterns on the plurality of pattern areas 31 on the substrate 2 by repeating the impressing operation.

Imprinting Method

The imprint processing performed by the imprint apparatus 1 will be described next. FIG. 5 is a flowchart illustrating a flow of the imprint processing according to the first exemplary embodiment.

The control unit 25 first controls a conveyance mechanism (not shown) that conveys the mold 4, and mounts the mold 4 on the mold chuck 16 (S100). Subsequently, while referring to the fiducial mark 27 on the substrate state 5, the measurement unit 40 measures the shape of the pattern portion by having the marks 36*b* be detected (S101).

Subsequently, the control unit 25 controls a conveyance mechanism (not shown) that conveys the substrate 2 and mounts the substrate 2 on the substrate stage 5, and the chuck 20 attracts the substrate 2 to the holding surface 20*a* with an attraction pressure that is the same as when forming a pattern (S102). The attraction pressure when forming a pattern is, hereinafter, referred to as first attraction pressure (first force). Not only the surface of the substrate 2 on which a pattern is formed, the surface (the surface on the chuck 20 side) of the substrate 2 on the opposite side with respect to the surface on which the pattern is formed desirably has a mirror-like finish as well.

Subsequently, the control unit 25 obtains the gap information (the information on the distance between the substrate 2 and the mount portion) using the measurement unit 40 (S103).

The gap information is a distribution of the difference in flatness between the substrate 2 and the chuck 20 at various positions of the holding surface 20*a*. In other words, the gap distribution is the difference between the shape distribution of the substrate 2 in the off-plate direction and the shape distribution of the chuck 20 in the off-plate direction. In the present exemplary embodiment, the gap information is obtained on the basis of the change in the position of the surface of the substrate (the amount of change in the substrate shape in the off-plate direction) when the attraction pressure applied by the chuck 20 is changed from the first attraction pressure described above to an attraction pressure (hereinafter, referred to as a second attraction pressure, that is, second force) that is larger than the first attraction pressure.

A process of S103 will be described with reference to the flowchart illustrated in FIG. 6. The flatness of the substrate 2 is measured first while the chuck 20 holds the substrate 2 with the first attraction pressure (S201). Subsequently, the vacuum pump 20*f* is controlled and the attraction pressure of the chuck 20 is changed to the second attraction pressure (S202).

The flatness of the substrate 2 is measured by the measurement unit 40 while the substrate 2 is held with the second attraction pressure (S203). Ultimately, the gap information is obtained (S204). Note that when the substrate is suctioned with the second attraction pressure, since the shape of the substrate 2 follows the shape of the holding surface 20*a*, it is assumed that flatness of the substrate 2 that is held with the second attraction pressure is the flatness of the chuck 20 that is the substrate mount surface.

After the gap information is obtained, the vacuum pump 20*f* is controlled and the attraction pressure of the chuck 20 is returned to the first attraction pressure (S205). Note that in cases in which a process of measuring the flatness of the substrate 2 is included while in the first attraction pressure, the timing of the measurement is not limited to that illustrated in the flowchart.

Figure 7A:
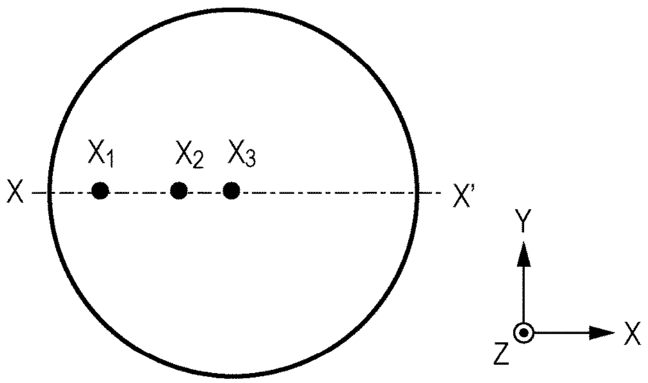
FIGS. 7A to 7C are diagrams illustrating a relationship between a gap distribution between a substrate and a mount surface, and a correction amount distribution.
Figure 7B:
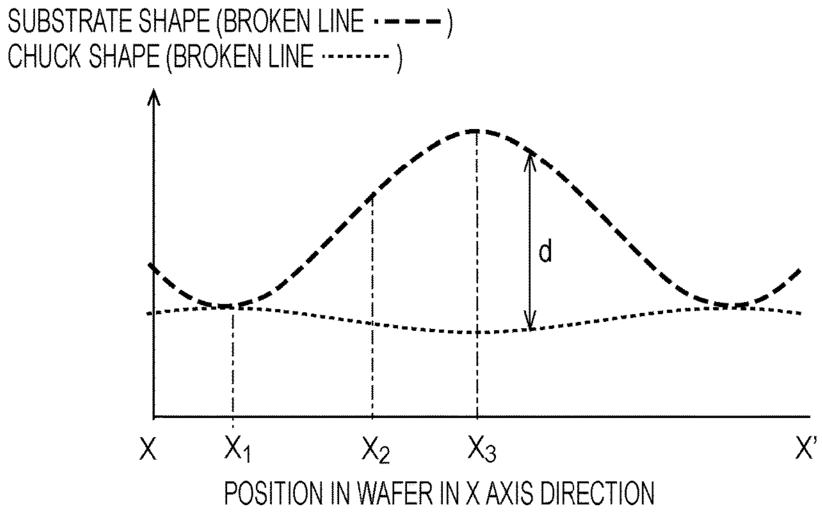
Figure 7C:
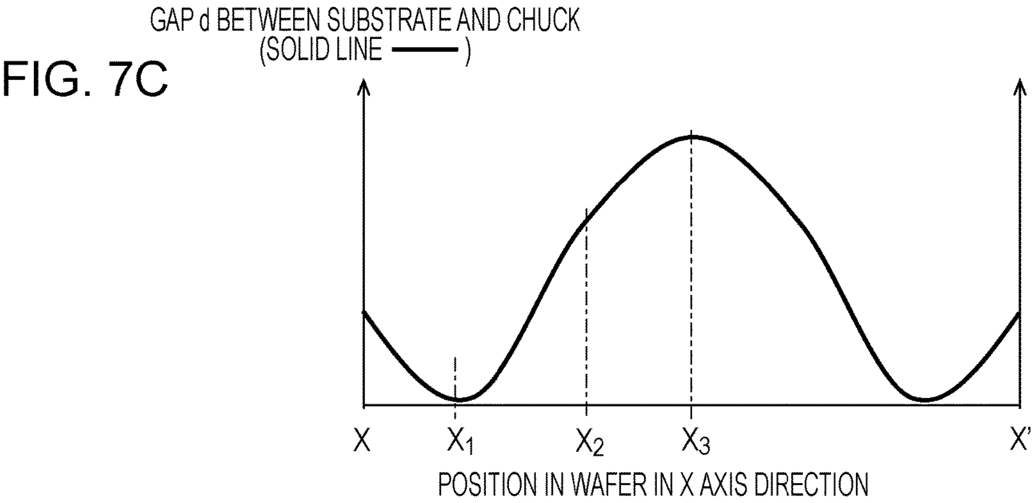

FIGS. 7A to 7C are diagrams illustrating the gap information. FIG. 7A is a diagram of the substrate 2 when viewed in the +Z direction. The positions of the X1, X2, and X3 on the straight line X-X' are that same as the positions of the X1, X2, and X3 illustrated in each of FIGS. 7B and 7C.

FIG. 7B illustrates each of the flatness in the cross-section taken along line X-X' in FIG. 7A. FIG. 7B illustrates the flatness of the substrate 2, which is the deformation amount (thick broken line) from a fiducial height that is the height of a flat surface, and the flatness of the chuck 20, which is the deformation amount (thin broken line) from the fiducial flat surface. Note that the flat surface is a surface that is defined by orthogonal two-axis components. In the present exemplary embodiment, the flat surface is a surface that is parallel to a surface defined by the X axis and the Y axis.

FIG. 7C illustrates a gap d between the substrate 2 and the chuck 20 at each of the positions in the cross-section taken along line X-X'. While it depends on the degree of warp of the substrate 2, the gap d is from about a submicron meter to a few hundred micrometers. The warp described herein is caused by residual stress in the substrate 2 owing to processes in the sequential manufacturing process such as, for example, an oxidation process, an ion implantation process, and a deposition process.

The fiducial height when obtaining the flatness of the substrate 2 and the fiducial height when obtaining the flatness of the chuck 20 are made to approach each other. The gap d is a difference in height between the substrate 2 and the chuck 20 obtained when the height of the surface of the substrate 2 and the height of the surface of the chuck 20 partially come in contact with each other at a certain position.

While FIGS. 7B and 7C exemplify the gap in a single axial direction, the control unit 25 obtains gap distributions at various positions in the entire area inside the surface of the substrate 2.

Returning to the description of the flowchart in FIG. 5, the alignment system 24 detects the marks 36*a* and measures the shape of the pattern area 31 (S104). From the measurement results obtained in S101 and S104, the control unit 25 obtains the standard heat quantity distribution that is to be applied to the pattern area 31 (S105). Note that the standard heat quantity distribution is a heat quantity distribution that is defined by the difference in shape between the pattern portion 4*a* and the pattern area 31 and the coefficient of linear expansion, and is a heat quantity distribution that does not rely on the position information in the substrate 2.

Subsequently, on the basis of the gap information obtained in S103, the control unit 25 corrects the standard heat quantity distribution (S106). First, among the gap information on the entire surface of the substrate 2 obtained in S103, the gap information on the portion corresponding to the pattern area 31 that is the target of pattern formation is obtained. On the basis of the above gap information, the correction amount of each position on the surface of the substrate is obtained.

Since the area in which the gap between the substrate 2 and the chuck 20 is small is closer to the point where the substrate 2 and the chuck 20 are in contact with each other, the frictional force exerted in an in-plane direction of the substrate 2 is larger and heat deformation does not easily occur. Accordingly, in the area in which the gap between the substrate 2 and the chuck 20 is small, the correction amount is determined while considering that the deformation amount of the substrate 2 per unit heat quantity is small compared to that in the area in which the gap between the substrate 2 and the chuck 20 is large.

In other words, when the correction amount in which the heat quantity is increased with respect to the heat quantity of the standard heat quantity distribution is a positive correction amount, and the correction amount in which the heat quantity is reduced is a negative correction amount, correction is made so that the correction amount (correction amount for correcting the heat quantity distribution in an area on the substrate where information related to the contact pressure is small) corresponding to the area with a small gap is larger than the correction amount (correction amount for correcting the heat quantity distribution in an area on the substrate where information related to the contact pressure is large) corresponding to the area with a large gap. Hereinafter, the heat quantity distribution corrected on the basis of the gap information is referred to as a corrected heat quantity distribution.

Subsequently, the substrate stage 4 moves the substrate 2 to a position under the dispenser, and the dispenser supplies the substrate 2 with the imprint material 3 (S107). The substrate stage 5 moves the substrate 2 under the mold 4 once again. Subsequently, on the basis of the corrected heat quantity distribution, the heating mechanism 15 heats the pattern area 31. With the above, the shape of the pattern area 31 is corrected to a desired shape (S108).

Subsequently, the drive mechanism of the mold 4 lowers the mold 4 so that the mold 4 approaches the pattern area 31, and the mold 4 is pressed against the imprint material 3 (S109). While the mold 4 is pressed, the deformation mechanism applies external force to the mold 4 in the horizontal direction such that the shape of the pattern portion is corrected to the desired shape (S110).

By appropriately combining a shape correction of a variable magnification component in which correction by mechanical force is effective, and a shape correction of an equal magnification component that is partially isotropic in which correction by heat is effective, a more high order (complex) shape correction can be achieved. With the above, the shape of the pattern portion and the shape of the pattern area 31 can be made close to each other and overlay precision can be improved. Note that the high-level correction component is a component that corrects a distorted shape such as, for example, a trapezoid component, a bow-shaped component, a barrel-shaped component, a spool-shaped component.

Furthermore, in S110, the alignment system 24 may measure the shape of the pattern portion and the shape of the pattern area 31, and may give a feedback of the measurement results to the deformation mechanism such that the measurement results are reflected in the shape correction of the pattern portion. With the above, the overlay precision can be improved further.

Subsequently, an alignment operation is performed by controlling the drive mechanism of the mold 4 and the substrate 2 such that the relative position between the pattern portion of the mold 4 and the pattern area 31 of the substrate 2 is regulated (S111). On the basis of the detection result of the relative position detected by the alignment system 24, the control unit 25 determines whether the overlay precision is within a permissible range (S112).

When the control unit 25 determines that the overlay precision is not within the permissible range (NO), the process returns to S110 and the shape correction of the pattern portion is performed again. When the control unit determines that the overlay precision is within the permissible range (YES), the process proceeds to S113.

Subsequently, the imprint material 3 is exposed through the mold 4 with the irradiation portion, and the imprint material 3 is cured (S113). Subsequently, as a mold release process, the drive mechanism of the mold 4 separates the mold 4 from the imprint material 3 (S114). The control unit 25 determines whether there is a succeeding pattern area 31 in which a pattern is to be formed (S115). When the control unit determines that there is a pattern area 31 (YES), the imprint apparatus 1 repeats the operation from S104 to S115. When the control unit 25 determines that there is no pattern area 31 (NO), the substrate 2 on which the imprint processing has been performed is carried out with the substrate conveyance mechanism described above (S116).

The control unit 25 determines whether there is a succeeding substrate 2 in which a pattern is to be formed (S117). When the control unit 25 determines that there is a succeeding substrate 2, operation from S102 to S117 is repeated on a new substrate 2. When determined that there is no succeeding substrate 2, the used mold 4 is collected by the mold conveyance mechanism described above and the program according to the present exemplary embodiment is ended (S118).

As described above, in the present exemplary embodiment, the standard heat quantity distribution is corrected on the basis of the gap information between the substrate 2 and the holding surface obtained by using the attraction pressure of the chuck 20. The obtained corrected heat quantity distribution is a heat quantity distribution in which the gap between the substrate 2 and the chuck 20 and the ease of deformation of the substrate 2 per unit heat quantity, which is different according to the gap, have been considered. Accordingly, compared with a case in which the shape of the pattern area 31 is corrected without using the gap information, the pattern area 31 can be deformed into a desired shape and the overlay precision can be improved.

Note that S105 and S106 may be performed concurrently while the substrate 2 is moved with the substrate stage 5 and while the substrate 2 is coated with the imprint material 3. Not based on the gap in the Z axis direction, by performing weighting on the correction amount on the basis of the distance of the substrate 2 in the in-plane direction, a similar advantageous effect can be obtained.

Second Exemplary Embodiment

Figure 8:
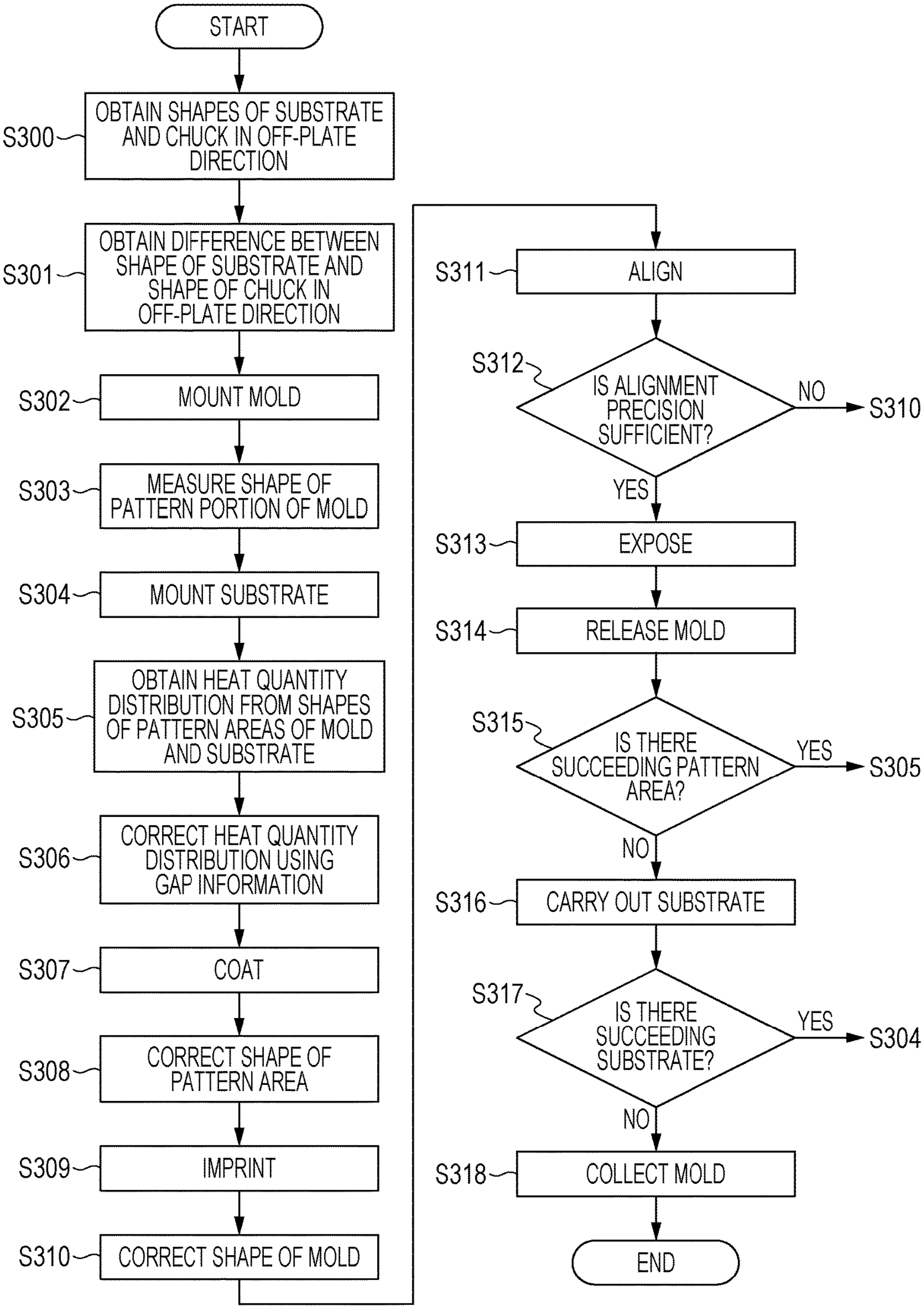
FIG. 8 is a flowchart illustrating a flow of the imprint processing according to a second exemplary embodiment.

A second exemplary embodiment is different from the first exemplary embodiment in that the flatness of the substrate 2 and the flatness of the holding surface 20*a* are obtained individually and the gap information is acquired on the basis of the two flatness. Furthermore, the imprint apparatus 1 of the second exemplary embodiment is different from that of the first exemplary embodiment in that the memory 26 stores the program illustrated in FIG. 8.

In an imprinting method according to the second exemplary embodiment, the measurement unit 40 first measures each of the flatness of the substrate 2 and the flatness of the chuck 20 (S300). In measuring the flatness of the substrate 2, various measuring instruments such as, for example, a spectral-interference laser displacement sensor, an electrostatic capacitance sensor, or a laser displacement sensor may be used. The flatness of the holding surface 20*a* is determined on the basis of the positions of the plurality of support members 20*b* of the chuck 20. Because of the above, as is the case of the spectral-interference laser displacement sensor, a measuring instrument in which a spot diameter of a measurement light is smaller than the diameter of the support members 20*b* is used.

The flatness of the substrate 2 is desirably obtained on the basis of the displacement between a position of the holding surface before the substrate 2 is mounted and a position of the surface of the substrate 2 when the substrate 2 is mounted and is held with an attraction pressure that is the same as the attraction pressure during impressing. With the above, the gap between the substrate 2 and the chuck 20 in an attracted and held state can be obtained in a further precise manner.

Subsequently, the control unit 25 using the measurement result in S300 obtains the gap information between the substrate 2 and the holding surface 20*a* (S301). A shape difference between the substrate 2 and the holding surface 20*a* corresponds to the gap information (information related to contact pressure).

Since the processes in S302 to S305 are similar to the processes in S100 to S102 and S104 to S106 of the first exemplary embodiment, description thereof is omitted. Subsequently, the control unit 25 using the gap information acquired in S301, corrects the standard heat quantity distribution on the basis of the gap information obtained in S301 and determines the heat quantity distribution applied to the pattern area 31 (S306). On the basis of the corrected heat quantity distribution obtained in S306, the imprint operation is repeated while heating the pattern area 31 (S307 to S318). Since each operation in S307 to S318 is similar to that in S107 to S118 of the first exemplary embodiment, description thereof is omitted.

In the present exemplary embodiment as well, by pressing the pattern portion 4*a* against the imprint material 3 while the pattern area 31 is heated and deformed on the basis of the corrected heat quantity distribution, the overlay precision can be improved.

Both the flatness of the substrate 2 and the flatness of the holding surface 20*a* do not necessarily have to be measured. In obtaining the gap information between the substrate 2 and the holding surface 20*a*, if which flatness is dominant is already known, the gap information may be obtained on the basis of the measurement result of the flatness of only either one of the substrate 2 and the holding surface 20*a*.

For example, in a case in which a pattern is formed on a substrate 2 for manufacturing a 3D memory, the gap information can be obtained by using the flatness of the holding surface 20*a* deemed as being the same as the flatness of the flat surface, and the flatness of the substrate 2. The flat surface is a surface that is defined by orthogonal two-axis components. In the substrate 2 for manufacturing the 3D memory, as the pattern is formed in multiple layers, a positional difference between the largest position in the Z axis direction and the smallest position in the Z axis direction is about 100 μm, which is a few ten times larger than a warp of a substrate 2 for a normal memory.

Third Exemplary Embodiment

A third exemplary embodiment is the same as the second exemplary embodiment in that the flatness of the substrate 2 and the flatness of the holding surface 20*a* are obtained individually and the gap information (the information related to the contact pressure) is acquired on the basis of the two flatness. However, third exemplary embodiment is different in that the measurement unit 40 is not provided inside the imprint apparatus 1 but is provided external to the imprint apparatus 1.

The measurement unit 40 measures the flatness of the substrate 2 and the flatness of the holding surface 20*a* at a portion external to the imprint apparatus 1. The measurement results are sent to the control unit 25. Subsequently, the control unit 25 obtains the gap information. When the standard heat quantity distribution is corrected on the basis of the gap information, compared with a case in which the shape of the pattern area 31 is corrected without using the gap information, the overlay precision can be improved. The present embodiment is suitable for a case in which the mounting space inside the imprint apparatus 1 is restricted.

Fourth Exemplary Embodiment

Even in areas where the distance between the substrate 2 and the holding surface 20*a* are zero, there are cases in which the contact pressure (force indicating the degree of contact) between the substrate 2 and the holding surface 20*a* differ in each of the areas. Since the frictional force exerted on the substrate 2 in the in-plane direction is different according to the difference in the contact pressure, there are cases in which the ease of deformation per unit heat quantity in the in-plane direction differ.

In a fourth exemplary embodiment, a statistical analysis is performed using the flatness of the substrate 2 while the substrate 2 is not attracted, the gap information, and the attraction pressure during impressing. With the above, the control unit 25 first acquires contact pressures at various positions in the surface of the substrate 2, that is, the control unit 25 acquires a contact pressure distribution (information related to the contact pressures, a second information). The control unit 25 obtains the corrected heat quantity distribution on the basis of the standard heat quantity distribution (first information) that is defined by the difference in shape between the pattern portion 4*a* and the pattern area 31, and on the basis of the contact pressure distribution.

The present exemplary embodiment can further improve the overlay precision by using the corrected heat quantity distribution determined in advance on the basis of the contact pressure distribution.

Note that at positions where the gap is larger than zero, the contact pressure may be set to zero.

Fifth Exemplary Embodiment

The flatness of the substrate 2 and the flatness of the chuck 20 are, in many cases, deviated about one period with respect to an ideal flat state. Accordingly, the gap information may not be values that correspond to each of the positions in the surface of the substrate 2.

In the present exemplary embodiment, a single correction amount $\alpha$ is determined in each pattern area 31. In other words, the correction amount $\alpha$ is a correction amount that is commonly used at each position in a single pattern area 31. The correction amount $\alpha$ is a mean value of the correction values of the standard heat quantity distribution obtained by the gap information in the same pattern area 31. For example, it is assumed that a corrected heat quantity distribution $F'(x,y)$ is a value in which a correction amount $\alpha$ is multiplied to a standard heat quantity distribution $F(x,y)$ of a certain pattern area 31. Alternatively, the corrected heat quantity distribution $F'(x,y)$ may be a value in which a correction amount $\alpha$ is evenly added to $F(x,y)$. A single correction amount $\alpha$ may be set to a predetermined number of pattern areas 31.

Rather than in each pattern area 31, the correction value may be set in each divided area that is obtained by dividing a single pattern area 31. By setting a common correction amount $\alpha$ in a single or a predetermined number of divided areas, the shape of the pattern area 31 can be corrected with better precision.

Since in the present exemplary embodiment as well, the shape of the pattern area 31 is corrected using the gap information, the overlay precision can be improved. Furthermore, the calculation process of calculating the corrected heat quantity distribution is simplified and a load on the control unit 25 can be reduced.

Other Exemplary Embodiments

Either one of the first to third exemplary embodiments having a different gap information measuring method may be combined with and applied to the fourth exemplary embodiment and the fifth exemplary embodiment. Furthermore, compared to the substrate 2, the frequency of measurement may be fewer in the holding surface 20*a*.

The gap information may be acquired using a substrate at the head of a lot, and the above gap information may be applied to all the other substrates 2 in the lot to obtain the corrected heat quantity distribution. Furthermore, while the shape of the substrate 2 is easily changed according to the formed pattern, since the chuck 20 is commonly used, the flatness of the holding surface is not easily changed. Accordingly, compared to the measuring frequency of the flatness of the substrate 2, the measuring frequency of the flatness of the chuck 20 may be reduced. With the above, decrease in throughput due to the application of each exemplary embodiment can be suppressed.

When the substrate 2 is held with the attraction pressure during impressing, a load may be applied to the chuck 20 itself and the chuck 20 may be deformed. In such a case, the change amount of the flatness of the chuck 20 before and after the attraction may desirably be stored in advance in the memory as an offset. By performing calculation while having the offset into consideration, the gap information can be obtained in a further precise manner.

Due to the unevenness in the thickness of the substrate 2, there may be cases in which the flatness is different between the surface of the substrate 2 on the mold 4 side and the surface on the chuck 20 side. In such cases, it is desirable that the gap information is acquired using the flatness information of at least the back side with an interferometer or the like.

While it may differ in each exemplary embodiment, the measurement unit 40 measures at least either one of the flatness of the substrate 2 and the chuck 20 in the off-plate direction.

The information related to the shape difference between the pattern area 31 and the pattern portion 4*a* may be the shape information of each area or may be a size ratio obtained by the shape information. On the basis of the above information, and information related to the contact pressure or the gap information, the corrected heat quantity distribution may be created without the creation of the standard heat quantity distribution.

The memory 26 may include, in advance, a standard heat quantity distribution corresponding to a predetermined deformation component of the pattern area 31, such as a barrel-shaped component, a bow-shaped component. In such a case, the control unit 25 determines the deformation component according to the measurement results of the marks 36*a* in the pattern area 31 and acquires the standard heat quantity distribution from the memory 26.

The standard heat quantity distribution and the corrected heat quantity distribution may be obtained while having in consideration that the shape of the pattern portion changes as well with the heat transmitted to the mold 4. The heat quantity that relatively corrects the shape may be determined using the coefficient of linear expansion (2.6 ppm/K in the case of silicon) of the material used in the substrate 2 and the coefficient of linear expansion (0.5 ppm/K in the case of quartz) of the material used in the mold 4.

Instead of the imprint material 3, an imprint material that is cured by various electromagnetic radiation including light or an imprint material that is cured by heat may be used. An imprint material that corresponds to the curing method employed in the imprint apparatus is selected.

The pattern of the cured material formed by using the imprint apparatus is used permanently in at least a portion of various articles or is temporality used when manufacturing various articles. The article includes an electric circuit element, an optical element, an MEMS, a recording element, a sensor, or a mold. The electric circuit element includes a volatile or a nonvolatile semiconductor memory, such as a DRAM, an SRAM, a flash memory, or an MRAM, and a semiconductor device, such as an LSI, a CCD, an image sensor, an FPGA. The mold includes a mold for imprinting.

The pattern of the cured material is used as it is as at least a portion of the components, or is temporality used as a resist mask. During the processing process of the substrate, the resist mask is removed after etching, ion injection, or the like has been performed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-171201, filed Aug. 31, 2015, which is hereby incorporated by reference herein in its entirety.

What is claimed is:

1. An imprint apparatus forming a pattern of an imprint material on a region of a substrate to be processed using a mold, the imprint apparatus comprising:

a mount portion on which the substrate is mounted;

a heating unit that heats the region to be processed, a measurement member that measures shape information of at least either one of the substrate and the substrate mount surface of the mount portion in a thickness direction of the substrate, and a control unit that controls the heating unit, wherein, on a basis of information related to a difference in shape between a pattern area of the mold and the region to be processed and information related to a contact pressure exerted between the substrate and the mount portion, the control unit controls the heating unit to heat the region to be processed such that the difference in shape between the pattern area of the mold and the region to be processed is reduced, and wherein, the information related to the contact pressure is information obtained on a basis of a distance between the substrate and the mount portion, the distance is obtained on the basis of a measurement result of the measurement member.

2. The imprint apparatus according to claim 1, wherein the mount portion includes an attraction unit that attracts the substrate to a substrate mount surface of the mount portion, and wherein the information related to the contact pressure is information obtained on a basis of a distance between the substrate and the mount portion, and attraction force of the attraction unit.

3. The imprint apparatus according to claim 1, wherein the mount portion includes an attraction unit that attracts the substrate to the mount portion, and wherein information on the distance is an amount of change in a shape of the substrate in the thickness direction obtained by the attraction unit changing the attraction force of the substrate.

4. The imprint apparatus according to claim 1, wherein information on the distance is a difference between shape information of the substrate in the thickness direction and a shape information of the mount portion in the thickness direction.

5. The imprint apparatus according to claim 1, wherein the heating unit heats the region to be processed on a basis of a heat quantity distribution obtained by correcting the information related to the difference in shape between the pattern area of the mold and the region to be processed by a correction amount obtained from information related to the contact pressure.

6. The imprint apparatus according to claim 5, wherein a correction amount for correcting the heat quantity distribution in an area on the substrate where information related to the contact pressure is small is larger than a correction amount for correcting the heat quantity distribution in an area on the substrate where information related to the contact pressure is large.

7. An imprint apparatus forming a pattern of an imprint material on a region of a substrate to be processed using a mold, the imprint apparatus comprising:

a mount portion on which the substrate is mounted; and a heating unit that heats the region to be processed, a measurement member that measures shape information of at least either one of the substrate and the substrate mount surface of the mount portion in a thickness direction of the substrate, and a control unit that controls the heating unit, wherein, on a basis of information related to a difference in shape between a pattern area of the mold and the region to be processed and information related to a distance between the substrate and the mount portion, the control unit controls the heating unit to heat the region to be processed such that the difference in shape between the pattern area of the mold and the region to be processed is reduced, and wherein the distance between the substrate and the mount portion is obtained on the basis of a measurement result of the measurement member.

8. The imprint apparatus according to claim 7, wherein the information related to the difference in shape between the pattern area of the mold and the region to be processed is a heat quantity distribution and the distance is information that corrects the heat quantity distribution, and wherein a correction amount for correcting the heat quantity distribution in an area on the substrate where the distance is small is larger than a correction amount for correcting the heat quantity distribution in an area on the substrate where the distance is large.

9. The imprint apparatus according to claim 8, wherein the imprint apparatus sequentially forms a pattern on a plurality of regions to be processed, and the correction amount for correcting the heat quantity distribution is information that is common among a predetermined number of regions to be processed.

10. The imprint apparatus according to claim 8, wherein when a plurality of divided areas that are formed by virtually dividing a single one of the region to be processed are set, the correction amount for correcting the heat quantity distribution is information that is common among the predetermined number of the divided areas.

11. The imprint apparatus according to claim 3, wherein the shape information of the substrate or the mount portion of the substrate mount surface in the thickness direction is deemed as shape information of a flat surface.

* * * * *